(12) United States Patent
Watts

(10) Patent No.: US 6,252,413 B1
(45) Date of Patent: *Jun. 26, 2001

(54) POSITIVE SIDE SUPPORT TEST ASSEMBLY

(75) Inventor: Rondell Kenneth Watts, Concord, NC (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/453,270

(22) Filed: Dec. 2, 1999

Related U.S. Application Data

(62) Division of application No. 08/963,235, filed on Nov. 3, 1997.

(51) Int. Cl.⁷ ................................................ G01R 31/02
(52) U.S. Cl. .................... 324/754; 324/758; 324/761
(58) Field of Search ...................... 324/754, 755, 324/758, 761, 760, 765

(56) References Cited

U.S. PATENT DOCUMENTS

| | | |
|---|---|---|
| 3,757,219 | 9/1973 | Aksu . |
| 4,099,120 | 7/1978 | Aksu . |
| 4,694,245 | 9/1987 | Frommes . |
| 4,812,754 | 3/1989 | Tracy et al. . |
| 4,820,976 | 4/1989 | Brown . |
| 4,857,009 | 8/1989 | Christensen . |
| 5,192,907 * | 3/1993 | Bonaria .............................. 324/758 |
| 5,408,189 * | 4/1995 | Swart et al. ........................ 324/758 |
| 5,461,323 * | 10/1995 | Yanagi et al. ...................... 324/754 |
| 5,500,606 | 3/1996 | Holmes . |
| 5,744,948 | 4/1998 | Swart . |
| 5,963,027 | 10/1999 | Peters . |
| 6,002,263 * | 12/1999 | Peters et al. ........................ 324/754 |

* cited by examiner

*Primary Examiner*—Ernest Karlsen
*Assistant Examiner*—Minh Tang
(74) *Attorney, Agent, or Firm*—Ratner & Prestia; Lawrence R. Fraley, Esq.

(57) ABSTRACT

A method and apparatus for testing through the connector of a circuit card. The apparatus includes a block, which may be tapered, to offset the force applied when engaging the connector. The block is adjustably mounted to accommodate testing of different-sized circuit cards.

6 Claims, 6 Drawing Sheets

POSITIVE SIDE SUPPORT TEST ASSEMBLY

This application is a divisional of U.S. Pat. application Ser. No. 08/963,235, filed on Nov. 3, 1997, which has been allowed.

TECHNICAL FIELD

This invention relates generally to a method and apparatus for preventing lateral motion of a circuit card. More specifically, this invention relates to a method and apparatus for supporting a circuit card while testing through a connector on the circuit card.

BACKGROUND OF THE INVENTION

Circuit cards are often tested to ensure that the circuitry within the card and the components on the card are present and functional. If a circuit card includes a connector, it is desirable to also test the connector. If a circuit card is tested without testing the connector the circuit card may successfully pass the test while not having the connector installed or while having a non-functional connector installed.

Circuit cards can be tested using a test fixture 100 as shown in FIG. 1, for example. The test fixture 100 includes a first plate 110 having locating pins 112, 114. The locating pins 112, 114 are located corresponding to the location of apertures in a circuit card 120. The locating pins 112, 114 are used to properly position the circuit card 120. The circuit card 120 shown in FIG. 1 is aligned in the test fixture 100 with the locating pins 112, 114 protruding through the apertures of the circuit card 120.

A probe block 130 including probes 116 is attached to the first plate 110. A backer gate 140 includes probes 142 and posts 144. The probes 142, 116 contact the circuit card 120 to test components on the circuit card 120 or the circuitry of the circuit card 120. Each probe 142, 116 contacts a designated signal on the circuit card 120. The posts 144 prevent the force of the probes 116 of the probe block 130 from bowing the circuit card 120.

Circuit cards 120 often include connectors 150 mounted on the circuit cards 120 as shown in FIG. 1. The probes 142, 116 can be used to test components on or the circuitry of the circuit card 120 but will not test the connector 150. To test the connector 150, a side access unit 160 engages the connector 150 with side probes 162. When the side probes 162 engage the connector 150, the side probes assert a force in the "A" direction upon the connector 150. Because the connector 150 is mounted on the circuit card 120, the force in the "A" direction is applied indirectly to the circuit card 120.

The number of side probes 162 needed to conduct a test increases as the number of connectors 150 on a circuit card 120 increases and as the number of pins on a connector 150 increases. The force in the "A" direction increases as the number of side probes 162 used to interconnect with the connector 150 increases.

The lateral motion of the circuit card 120 due to the force applied by the side probes 162 is opposed by the locating pins 112, 114 which are used to position the circuit card 120. As the number of side probes 162 increases, however, the force may become excessive and the locating pins 112, 114 may bend or the apertures in the circuit card 120 may elongate, thus allowing the circuit card 120 to move laterally. This results in damaged locating pins 112, 114 or a damaged circuit card 120. If the probes 142, 116 were in contact with the circuit card 120 when the side probes 162 caused the circuit card 120 to move laterally, the probes 142, 116 may also be bent and damaged.

In addition to costs resulting from the damage to the locating pins 112, 114, to the probes 116, 142, and to the circuit card 120, lateral movement of the circuit card 120 will result in the circuit card 120 being incorrectly positioned. The probes 116, 142 are located to contact signals on the circuit card 120. Successful contact with the signals on the circuit card 120 depends on the circuit card 120 being in a desired location. When the circuit card 120 is incorrectly positioned, the probes 116, 142 may not contact their designated signals on the circuit card 120. The probes 116, 142 may contact an incorrect signal or no signal. This may result in a test failure of a circuit card 120 that is properly functional or result in test failures that are erroneously attributed to a misaligned circuit card 120.

An edge block 170 as shown in FIG. 1 may be used to offset the force in the "A" direction applied by the side probes 162. The use of an edge block 170 is effective when the distance "B", which is the length of the circuit card 120 that extends past the locating pin 114, equals the distance between the locating pin 114 and the edge block 170. Due to manufacturing tolerances, however, the distance "B" on circuit cards 120 is inconsistent. The distance "B" typically varies by ±0.51 mm (±20 mils).

If the distance "B" is less than the distance from the locating pin 114 to the edge block 170, the force in the "A" direction will not be offset by the edge block 170 until the locating pins 112, 114 have bent or the apertures in the circuit card 120 have elongated. If the distance "B" is greater than the distance from the locating pin 114 to the edge block 170, the circuit card 120 will not fit on the first plate 110.

To overcome the shortcomings of conventional circuit card testing, a new test apparatus is provided. An object of the present invention is to provide an apparatus for preventing the lateral movement of a circuit card. A related object is to provide an improved test apparatus for testing circuit cards by preventing lateral motion of the circuit card during testing. Another object of the present invention is to prevent lateral motion of a circuit card during testing when the location of the end of the circuit card is variable.

SUMMARY OF THE INVENTION

To achieve these and other objects, and in view of its purposes, the present invention provides an apparatus that opposes the lateral movement of a circuit card. Lateral movement of the circuit card is prevented by engaging an end of the circuit card.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
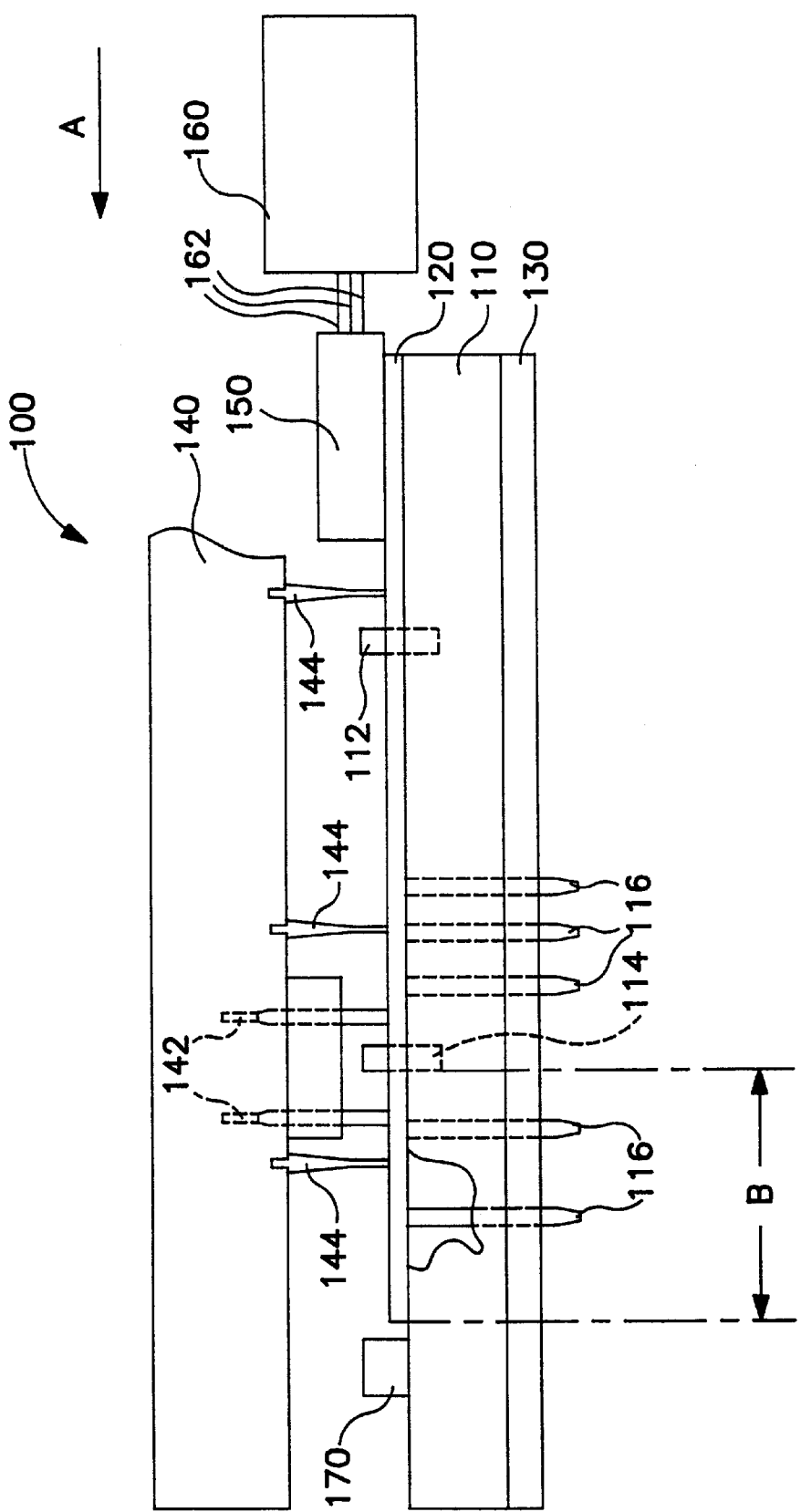
FIG. 1 is a conventional circuit card testing apparatus.
Figure 2A:
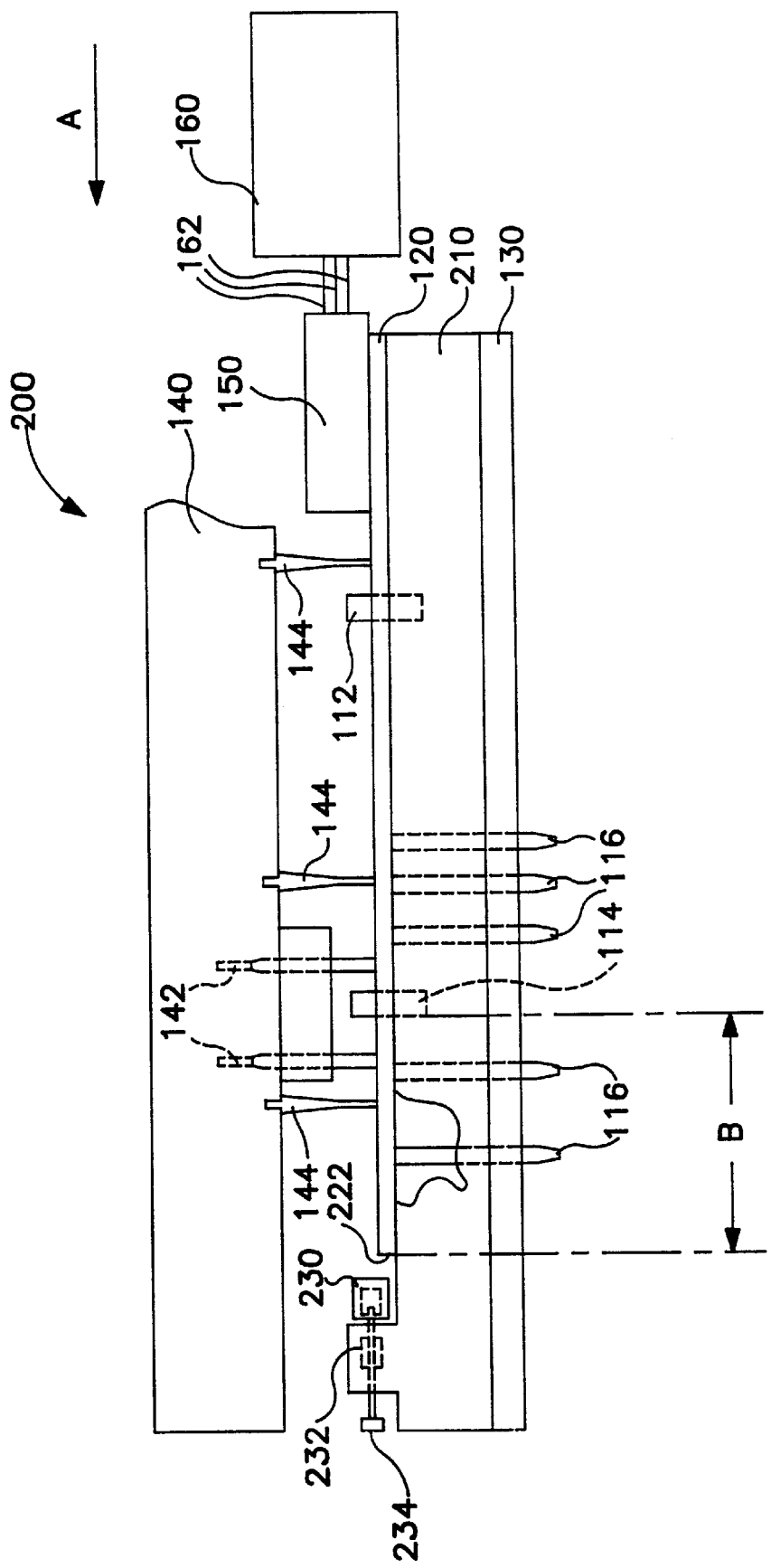
FIG. 2A is a sectional view of a first exemplary embodiment according to the present invention.

Referring now to the drawing, wherein like reference numerals refer to like elements throughout, FIG. 2 shows a test system according to a first exemplary embodiment of the invention. In FIG. 2, the present invention is implemented in an apparatus 200 for testing a circuit card 120. The apparatus 200 opposes lateral motion of a circuit card 120 by engaging an end 222 of the circuit card 120. The end 222 of the circuit card 120 is engaged by a card block 230. The card block 230 is adjustably mounted to a first plate 210. The card block 230 can be adjustably mounted using a spring 232, for example.

For testing a circuit card 120, the circuit card is placed upon the first plate 210 with apertures in the circuit card 120 aligned with the locating pins 112, 114 of the first plate 210. The backer gate (or second plate) 140 is lowered to a position above the circuit card 120 as shown in FIG. 2. The probes 142, 116 contact the circuit card 120 for testing components or circuitry of the circuit card 120. The posts 144 contact the circuit card 120 to prevent the circuit card 120 from bowing due to upward pressure of the probes 116 of the probe block 130.

When the side probes 162 of the side access unit 160 interconnect with the connector 150, the bolt 234 is released to allow the spring 232 to drive the card block 230 into the end 222 of the circuit card 120. Thus, the force in the "A" direction exerted by the side probes 162 to interconnect with the connector 150 is opposed by the card block 230 asserting an opposing force against the edge 222 of the circuit card 120. By balancing the force exerted by the card block 230 and the force exerted by the side probes 162, the locating pins 112, 114 and probes 142, 116 are not damaged and the probes 142, 116 contact the circuit board 120 at desired locations. Because the card block 230 is adjustably mounted, the card block 230 can be used to engage the end 222 of the circuit card 120 even if the distance "B" from the locating pin 114 to the end 222 of the circuit card 120 varies.

The number and type of connectors 150 mounted on a circuit board 120 may vary. As the number of connectors 150 increases or the number of pins per connector 150 increases, the number of side probes 162 required will also increase. This results in an increased force in the "A" direction upon the circuit card 120. To compensate for changes in the force exerted by the side probes 162, the spring 232 may be changed or its tension adjusted.

Figure 2B:
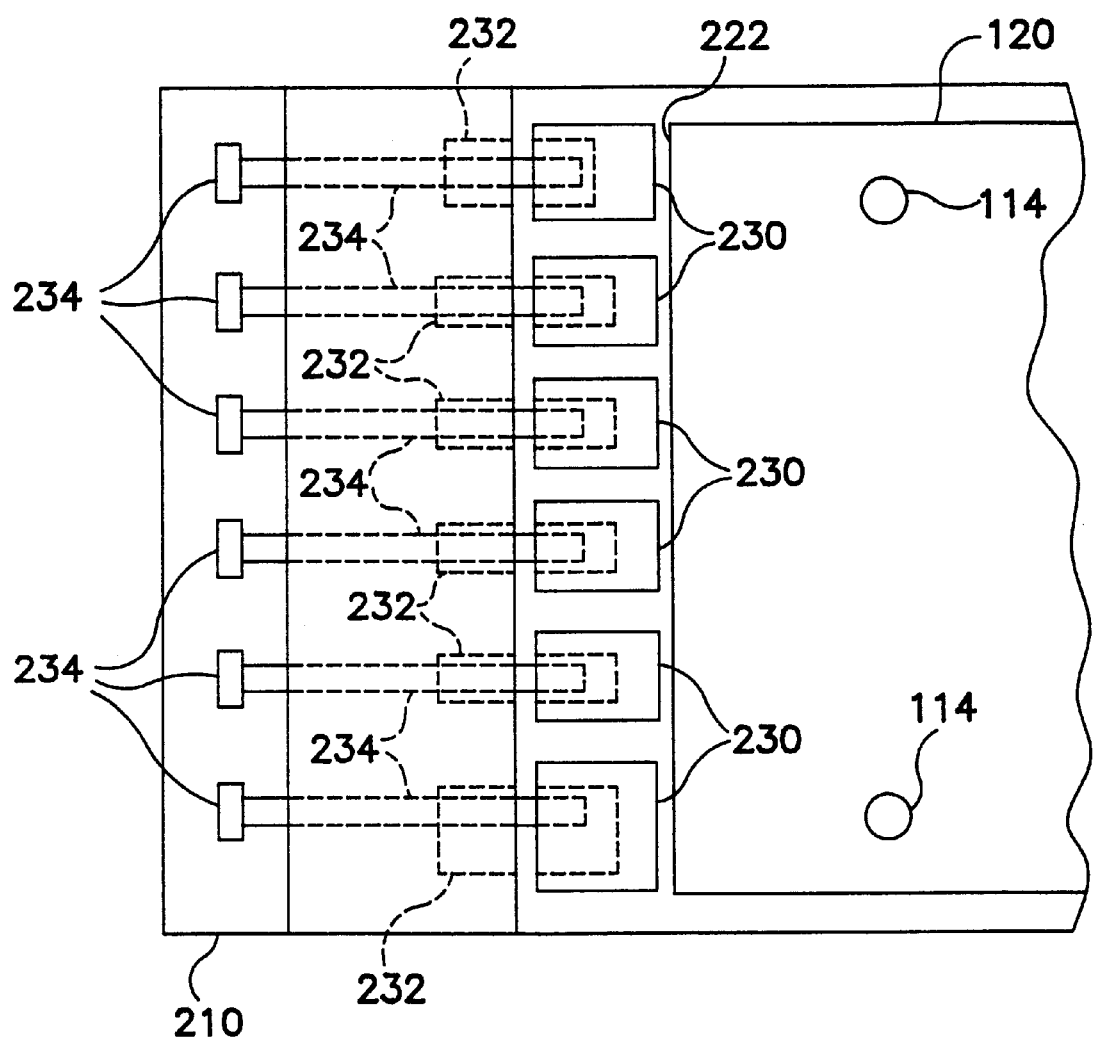
FIG. 2B is a top view of a variation of the present invention incorporating the exemplary embodiment shown in FIG. 2A.

As shown in FIG. 2B, multiple adjustable card blocks 230 may be used to compensate for differences in the force exerted by the side probes 162 between different circuit cards 120. When the force exerted by the side probes 162 decreases, the bolts 234 of a decreased number of card blocks 230 will be released. When the force exerted by the side probes 162 increases, the bolts 234 of an increased number of card blocks 230 will be released. The force exerted by one or more card blocks 230 is adjusted to closely match the force exerted by the side probes 162. Thus the force on the locating pins 112, 114 is minimized to prevent damage to the locating pins 112, 114, the probes 142, 116, or to the circuit card 120.

Figure 3:
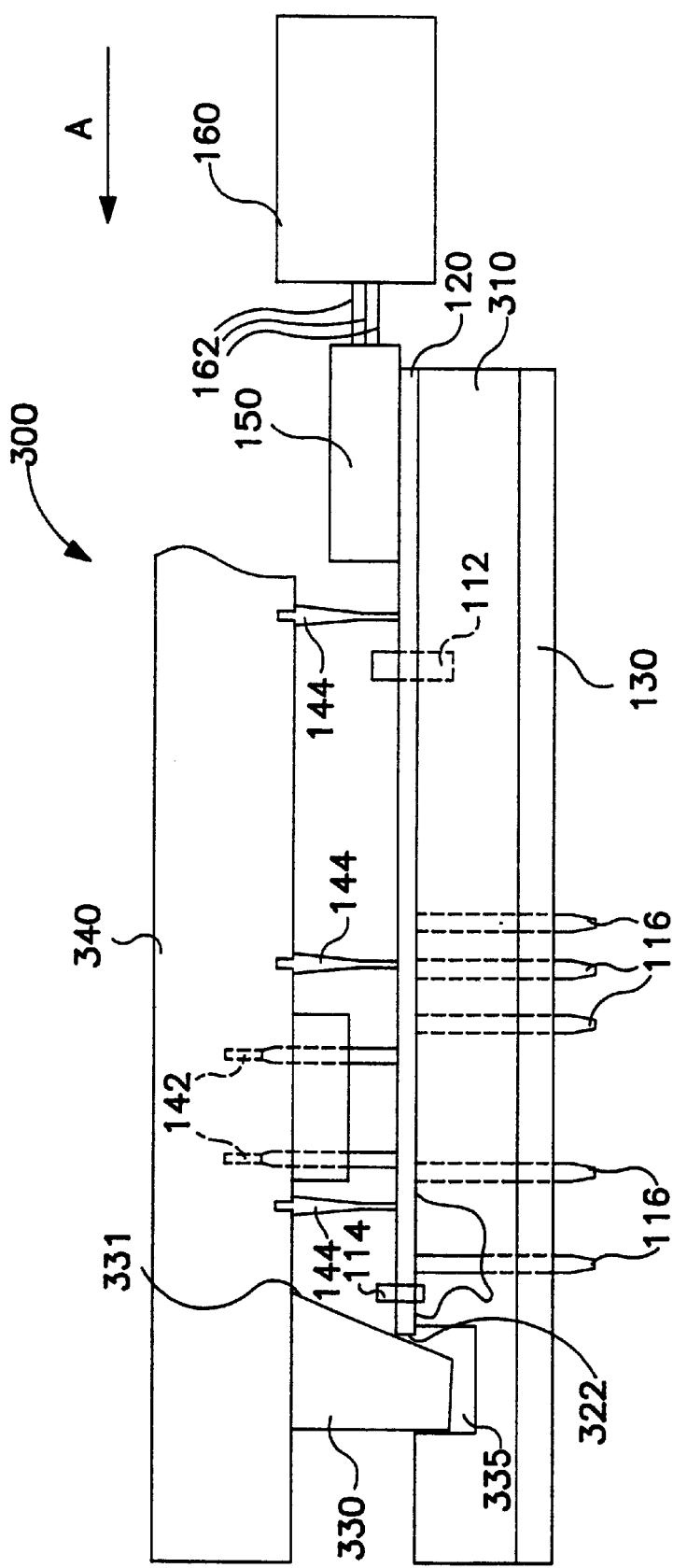
FIG. 3 is a sectional view of a second exemplary embodiment according to the present invention.

Another exemplary embodiment of the present invention is shown in FIG. 3. The apparatus 300 includes a card block 330 that opposes the lateral motion of the circuit card 120 by engaging the end 322 of the circuit card 120. For testing a circuit card 120, the circuit card is placed upon the first plate 310 with apertures in the circuit card 120 aligned with the locating pins 112, 114 of the first plate 310. The backer gate 340 is lowered to a position above the circuit card 120 until the tapered side 331 of the card block 330 engages the end 322 of the circuit card 120. The first plate 310 has a cavity 335 into which the card block 330 is inserted. The probes 142, 116 contact the circuit card 120 for testing components or circuitry of the circuit card 120. The posts 144 contact the circuit card 120 to prevent the circuit card 120 from bowing due to upward pressure of the probes 116 of the probe block 130.

When the side probes 162 of the side access unit 160 interconnect with the connector 150, the force in the "A" direction exerted by the side probes 162 to interconnect with the connector 150 is opposed by the card block 330. The card block 330 prevents lateral motion of the circuit card 120 in the "A" direction and prevents the force exerted by the side probes 162 from damaging the locating pins 112, 114 or the probes 142, 116.

Figure 4:
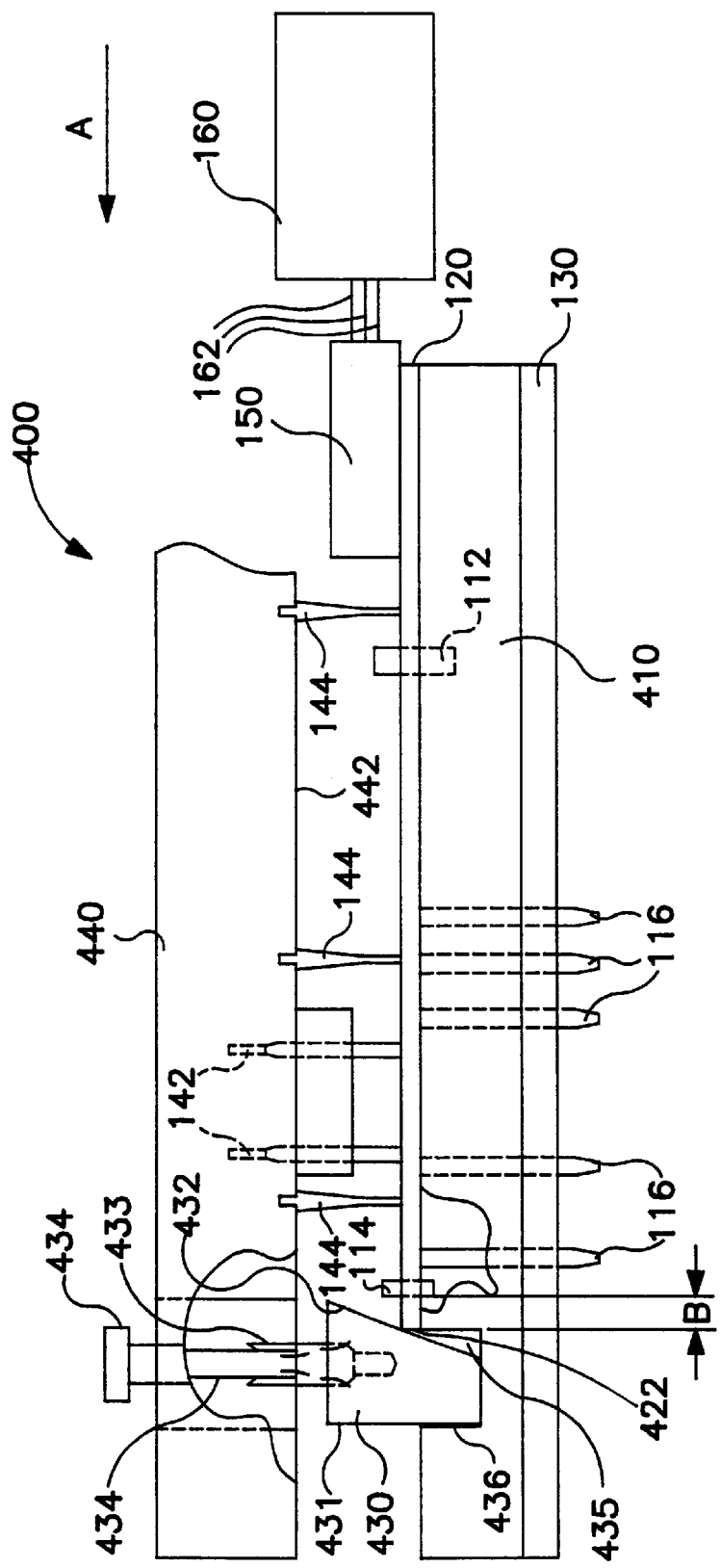
FIG. 4 is a sectional view of a third exemplary embodiment according to the present invention in a first position.

Another exemplary embodiment of the present invention is shown in FIG. 4. The apparatus 400 includes a card block 430 that opposes the lateral motion of the circuit card 120 by engaging the end 422 of the circuit card 120. The card block 430 is adjustably mounted on the bottom 442 of the backer gate 440 by a bolt 434 and a spring 433. The spring 433 pushes the block 430 downward away from the backer gate 440 and toward the first plate 410.

The card block 430 has a first side 431 and a second side 432. The second side 432 is tapered and opposite the first side 431. When the backer gate 440 is lowered to a position above the first plate 410, the card block 430 enters a cavity 435 in the first plate 410 until the second side 432 of the card block 430 engages the end 422 of the circuit card 120. The backer gate 440 is lowered to its desired position above the first plate 410 and the tension of the spring 433 maintains the position of the card block 430. Preferably, the first side 431 of the card block 430 is adjacent the sidewall 436 of the cavity 435, and the sidewall 436 may support the card block 430 laterally in opposing a force in the "A" direction.

The card block 430 as shown in FIG. 4 has reached the bottom of the cavity 435. The depth and width of the cavity 435 and the size and taper of the card block 430 are designed so the bottom of the card block 430 will only reach the bottom of the cavity 435 when the distance "B" of the circuit card 120 is a minimum.

Figure 5:
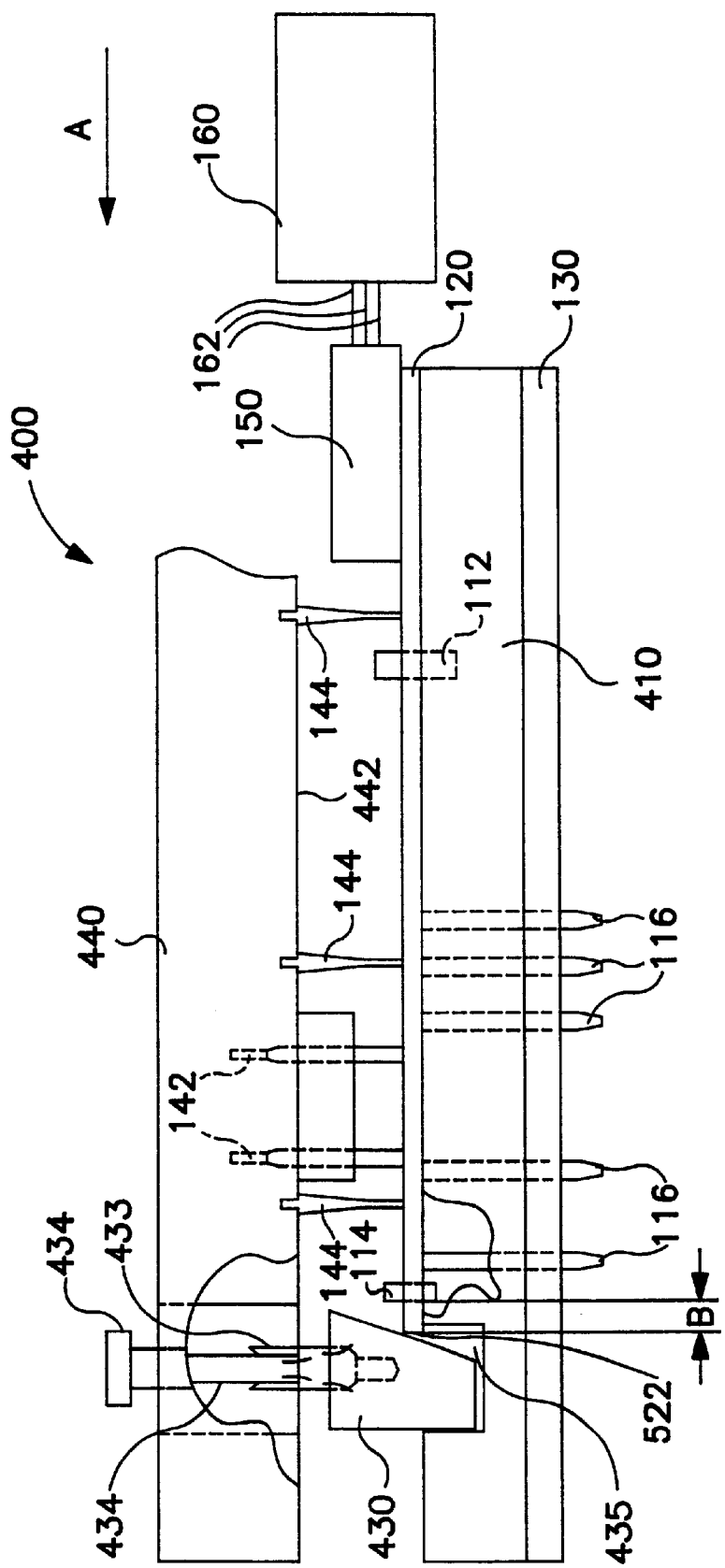
FIG. 5 is a sectional view of the third exemplary embodiment, shown in FIG. 4, in a second position.

As shown in FIG. 5, as the distance "B" increases, the extent to which the card block 430 extends into the cavity 435 decreases. The depth and width of the cavity 435 and the size and taper of the card block 430 are designed so the top of the card block 430 is not adjacent the bottom of the backer gate 440 unless the distance "B" is at a maximum as shown in FIG. 5.

The present invention allows testing of circuit cards without lateral motion of the circuit cards. This can be implemented with existing probe blocks and minor modifications to the top plate and to the backer gate of a testing system. The application of the present invention is not limited to preventing lateral motion of circuit cards of a single product type.

The present invention is also not limited to blocking the end of a circuit card. The end or edge of a component on the circuit card can be blocked. For example, the end of a connector may be blocked to oppose the force exerted by side probes interconnecting with the connector. Blocking a component such as a connector must be done carefully to avoid damaging the soldered connections of the connector to the circuit card.

The present invention has been described above with regard to preventing the lateral motion of a circuit card in a single direction. The teachings of this invention can be applied to oppose lateral forces in multiple directions upon a circuit card. This may be necessary, for example, when a circuit card has connectors mounted on more than one end of the circuit card.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention. The present invention has been described as implemented for preventing lateral motion of a circuit card during testing. The applications of the present invention are not limited, however, to circuit card testing.

What is claimed:

1. An apparatus for preventing lateral motion of a circuit card having apertures and an end, the apparatus comprising:
   at least one adjustable block having an engaging surface for adjustably engage the end of the circuit card,
   a first plate having locating pins located corresponding to the apertures in the circuit card,
   wherein the adjustable block is adapted to engage the end of the circuit card with a force opposing a lateral force when the circuit card is upon the first plate with the locating pins protruding through the apertures of the circuit card, and the engaging surface of the adjustable block being displaceable in the direction opposing the lateral force.

2. The apparatus according to claim 1, wherein the circuit card includes a connector mounted thereon at the connector end opposite the end and a probe asserts a force in a first direction from the connector end toward the end when interconnecting with the connector and the block is configured to oppose the force.

3. The apparatus according to claim 1, further comprising a second plate above the first plate, wherein the second plate has a bottom and the adjustable block is mounted on the bottom.

4. A system for testing a circuit card having an end, the system comprising:

an adjustable block preventing lateral motion of the circuit card, the adjustable block having an engaging surface for adjustably engaging the end of the circuit card; and testing means for testing the circuit card, wherein the circuit card includes a connector mounted thereon and the testing means comprises a side access unit having side probes interconnecting with the connector and applying a first force in a first direction when interconnecting with the connector, the adjustable block opposing the first force by the engaging surface of the adjustable block engaging the end of the circuit card and being displaceable in the direction opposing the first force.

5. The system according to claim 4, further comprising a first plate.

6. The system according to claim 5, wherein the first plate includes locating pins located corresponding to apertures in the circuit card.

* * * * *